(12) United States Patent
Miyamura et al.

(10) Patent No.: US 10,791,647 B1
(45) Date of Patent: Sep. 29, 2020

(54) CARRIER SAFETY DEVICE FOR HEAVY EQUIPMENT IN AN IMMERSION COOLING SYSTEM

(71) Applicant: Baidu USA LLC, Sunnyvale, CA (US)

(72) Inventors: Harold Miyamura, San Jose, CA (US); Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 16/457,283

(22) Filed: Jun. 28, 2019

(51) Int. Cl.
  *H05K 7/20* (2006.01)
  *H05K 7/14* (2006.01)
  *H05K 5/02* (2006.01)
  *G06F 1/20* (2006.01)

(52) U.S. Cl.
  CPC .......... *H05K 7/20236* (2013.01); *G06F 1/20* (2013.01); *H05K 5/023* (2013.01); *H05K 5/0221* (2013.01); *H05K 7/1487* (2013.01); *H05K 7/1489* (2013.01); *H05K 7/20272* (2013.01); *H05K 7/20763* (2013.01); *G06F 2200/201* (2013.01)

(58) Field of Classification Search
  CPC ... G06F 1/20; G06F 2200/201; H05K 5/0221; H05K 5/023; H05K 7/1487; H05K 7/1489; H05K 7/20236; H05K 7/20272; H05K 7/203; H05K 7/20763
  See application file for complete search history.

(56) References Cited

U.S. PATENT DOCUMENTS

| 10,653,036 | B1* | 5/2020 | Gao ................... | H05K 7/20781 |
| 2013/0106265 | A1* | 5/2013 | Shelnutt ............. | H05K 7/20254 312/236 |
| 2015/0060009 | A1* | 3/2015 | Shelnutt ............. | H05K 7/20809 165/11.1 |
| 2017/0172011 | A1* | 6/2017 | Chen ................... | H05K 7/20254 |
| 2017/0311484 | A1* | 10/2017 | Ozyalcin ............ | H05K 7/20645 |
| 2018/0027690 | A1* | 1/2018 | Chen ...................... | F16C 29/02 384/41 |
| 2018/0196484 | A1* | 7/2018 | Saito ................... | H05K 7/20236 |
| 2019/0037713 | A1* | 1/2019 | Zhai ...................... | H05K 5/0221 |
| 2019/0059170 | A1* | 2/2019 | Lee ....................... | H05K 5/0221 |
| 2019/0364693 | A1* | 11/2019 | Nishiyama ......... | H05K 7/20272 |

* cited by examiner

*Primary Examiner* — Jacob R Crum
(74) *Attorney, Agent, or Firm* — Womble Bond Dickinson (US) LLP (57) ABSTRACT

A liquid immersion cooling systems can include an immersion tank for housing cooling liquid, and a carrier tray. The carrier tray can include a mounting mechanism to attach one or more electronic components to the carrier tray, one or more handles, and one or more extendable sliders, each having a first connection to the carrier tray and a second connection to the immersion tank. The immersion tank can have an opening that faces upward. In a first position of the one or more extendable sliders, the carrier tray is within the immersion tank, and in a second position of the one or more extendable sliders, the carrier tray is vertically lifted out of the opening of the immersion tank.

20 Claims, 8 Drawing Sheets

(PERSPECTIVE VIEW)
FIG. 6

(FRONT VIEW)
FIG. 7

CARRIER SAFETY DEVICE FOR HEAVY EQUIPMENT IN AN IMMERSION COOLING SYSTEM

TECHNICAL FIELD

Embodiments of the present disclosure relate generally to a data center cooling management. More particularly, embodiments of the disclosure relate service, handling and safety in data centers using an immersion cooling system.

BACKGROUND

Data centers having a plurality of networked computing devices (e.g., servers) can require thermal management to cool the computing devices. High power servers (for example, servers that perform artificial intelligence applications) that might generate large amounts of thermal energy can be cooled using liquid immersion systems. In such systems, the servers are immersed in a liquid which absorbs and transfers thermal energy from the server (or other electronic equipment) to the liquid.

In an immersion cooling system, computer electronics can be immersed in, and in direct contact with, a non-electrically conductive liquid. The liquid absorbs thermal energy from the computer electronics. The temperature of the liquid can be controlled within a defined 'safe range' by known techniques (for example, with a heat exchanger and pump), thereby cooling the servers and other support equipment (e.g., back-up battery systems).

Liquid immersion cooling systems can have a higher heat transfer capability than traditional air and liquid (e.g. direct to chip, with heat sinks and cold plates) cooling systems, while also greatly reducing the physical footprint of servers because the electronics can be packaged much closer together, e.g., in a field replaceable unit (FRU), due to the high heat transfer capability of immersion cooling.

Problems and difficulties are identified relating to servicing of servers in an immersion cooling system. A server module might need to be removed for maintenance, inspection, or replacement. For vertical immersion tanks with upward facing openings, servicing a server might require extracting the server up and out of the immersion tank through the opening, by manually pulling the server out (e.g., through handles). Server modules can be heavy, e.g., greater than 100 lbs. Thus, to properly service heavy data center equipment, one or two technicians might be required to lift the equipment out of the immersion tank and balance it upright, while another technician services the equipment (e.g., replacing, inspecting, or repairing a graphics processing unit (GPU), a central processing unit (CPU), or memory module). In addition, heavy data center equipment such as battery back-ups (BBUs) and power supply units (PSUs) can weigh up to 500 lbs, and if only partially removed from fluid, battery pack replacement can be replaced with less effort, than full extraction and insertion for service.

In addition, because the server module is immersed in a liquid, the server might drip liquid when removed from the immersion tank for servicing. Thus, the server module might be carried to a dedicated space, e.g., a fluid capture tray or spill containment area, to reduce spilling of the liquid during servicing. Another technique can be to apply spill absorbing material in the work area to prevent slipping, but this requires periodic maintenance of fluid absorbing material on the floor, as the spill wipe absorbing capabilities of the absorbing material decreases over time.

In addition, the server can be dropped or inadvertently tipped over during servicing because of a lack of support in holding the server during servicing. This issue can be worsened by immersion liquid which can be slippery and further increase the risk of injury to users and/or damage to equipment.

Accordingly, servicing in an immersion cooling system environment can be time-consuming given the number of technicians required and the effort required in maintaining a drip-free area for safe handling of equipment.

In addition to safety and servicing issues, different data center equipment can have different form factors (e.g., based on different standards). Thus, an immersion tank may have to accommodate such different form factors, in a manner suitable for servicing. The issues identified above are addressed with features described in the present disclosure.

BRIEF DESCRIPTION OF THE DRAWINGS

Embodiments of the invention are illustrated by way of example and are not limited by the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Aspects of the present disclosure allow accessibility and servicing for heavy data center equipment in the local immersion cooling enclosure/tank service area. Features of the described system allow heavy equipment to be suspended and serviced directly over the immersion tank, using positive lock features, without completely removing the equipment from the immersion tank and transporting the heavy equipment to a dedicated rework station. In this manner, fluid spills are reduced. Hand slippage and damage to heavy equipment due to slips, trips, and falls, during the installation and extraction process can be eliminated. The system and described features allow for the equipment to be installed in the immersion enclosure in a preferred orientation.

According to one aspect of the present disclosure, a carrier assembly for use an immersion cooling system is described. The carrier assembly can include a carrier tray having a mounting mechanism to attach one or more electronic components (e.g., data center equipment such as a server, a BBU, PSU, or other field replaceable units (FRU)) to the carrier tray; one or more handles; and an extendable slider having a first connection to the carrier tray and a second connection to an immersion tank.

The immersion tank has an opening that faces upward. In a first position of the extendable slider, the carrier tray is held within the immersion tank (and in a non-electrically conductive liquid). In a second position, the carrier tray is vertically lifted out of the opening of the immersion tank. The carrier tray can be lifted out partially (e.g., halfway) or completely, depending on the servicing requirement (e.g., what components need to be serviced and where are those components located). The carrier tray can be securely held in place in the second position by a locking system, which can be integral to the extendable slider.

According to another aspect, a liquid immersion cooling system can include an immersion tank for housing cooling liquid (e.g., a non-electrically conductive liquid) and a carrier tray. The carrier tray can have a) a mounting mechanism to attach one or more electronic components to the carrier tray; b) one or more handles for lifting the carrier tray out of the immersion tank; and c) one or more extendable sliders, each having a first connection to the carrier tray and a second connection to the immersion tank. The vertical immersion tank has an opening that faces upward. With this configuration, the immersion tank can be opened at the top and the liquid will stay in the tank (held there by gravity), as opposed to the horizontal immersion solution, in which the server itself is hermetically sealed and partially filled with immersion fluid. The server is installed in a vertical data center rack, with blind mate fluid connections to an immersion fluid rack manifold at the rear of the server. Returning back to aspects of the present disclosure, in a first position of the one or more extendable sliders, the carrier tray is within the immersion tank (e.g., immersed in the cooling liquid). In a second position of the one or more extendable sliders, the carrier tray is vertically lifted out of the opening of the immersion tank, at least partially. The carrier tray can be securely held in place in the second position by a locking system, which can be integral to the extendable slider.

The data center equipment (e.g., server, BBU or PSU) can be serviced while the carrier tray holds the equipment over the immersion tank. This can reduce the need for multiple technicians to lift, hold, and simultaneously service the equipment. Furthermore, because the carrier tray can be held by the extendable sliders over and above the immersion tank opening, the liquid can drip back into the immersion, thereby reducing spillage of the liquid in the area.

Typical vertical immersion tanks can have a standing height of 1-1.2 meters. Without the described immersion cooling system of the present disclosure, two or more continuous manual operations (lift, extract, spill control, and stabilize, with no break in between) are required to lift heavy equipment out of the tank for any type of service, which can be error-prone, painful, inefficient, and difficult, as described in other sections.

Figure 1:
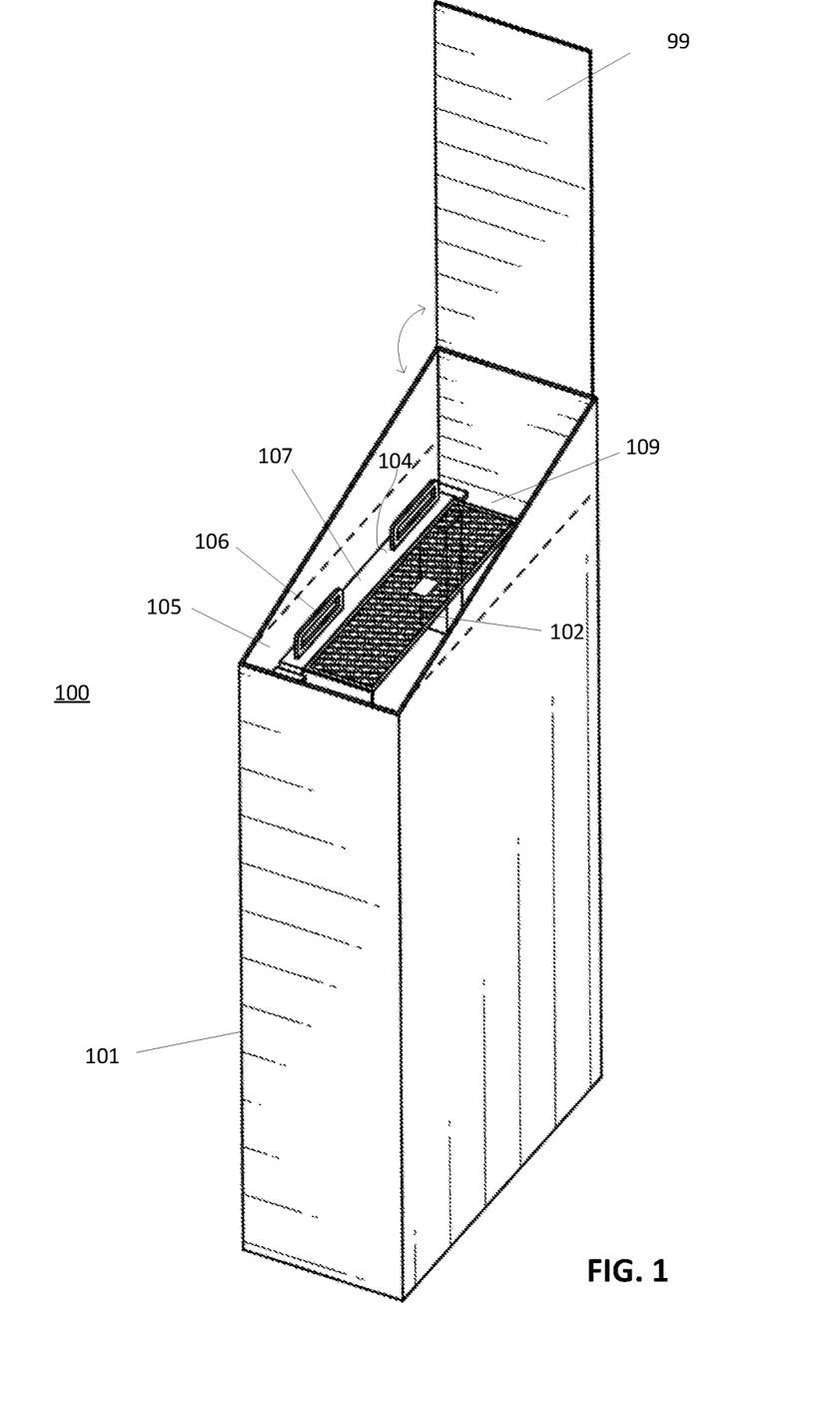
FIGS. 1 and 2 show a liquid immersion cooling system, according to one embodiment.
Figure 2:
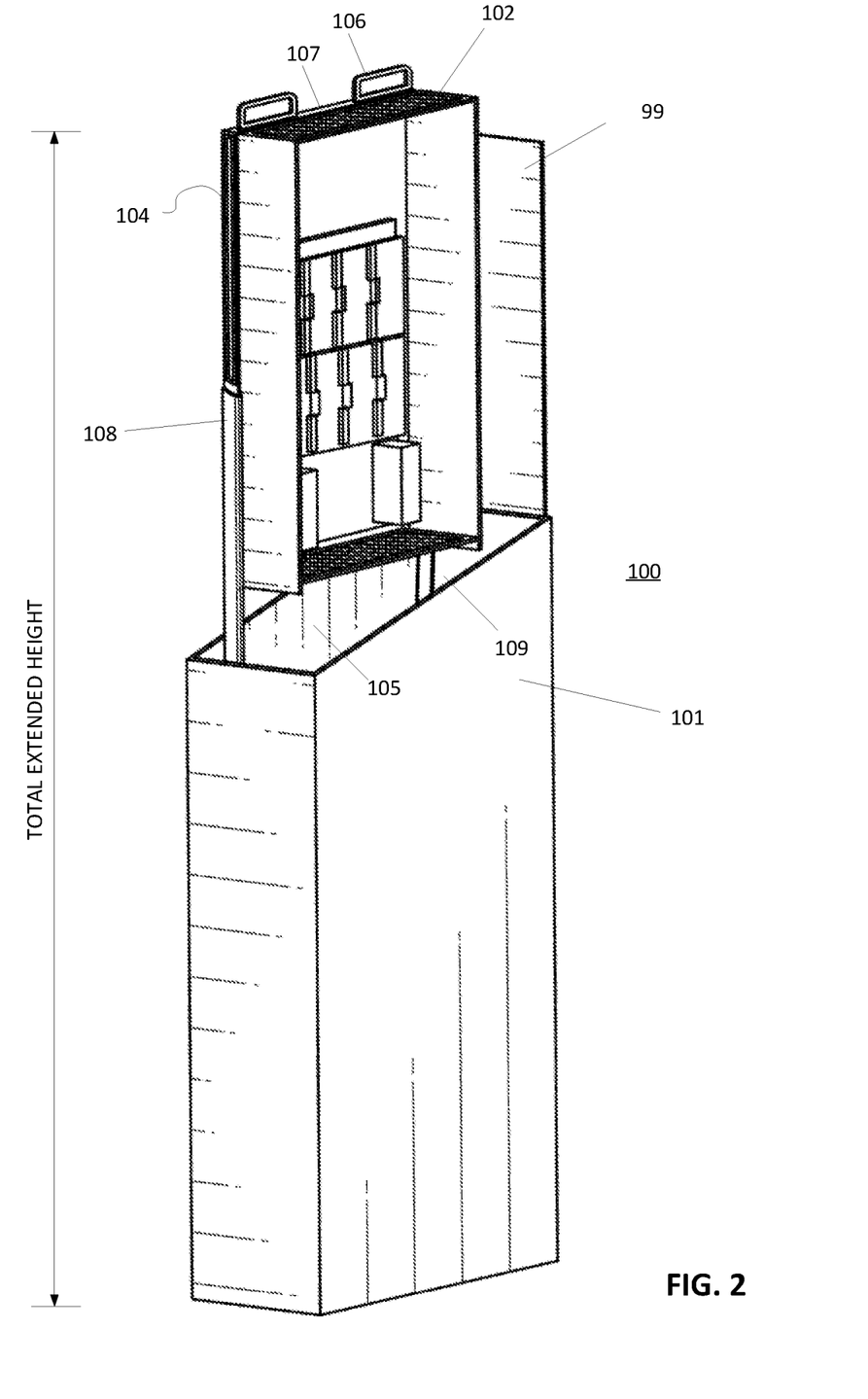

Referring to FIGS. 1 and 2, a liquid immersion cooling system 100 is shown. The system includes an immersion tank 101 that has an opening at a top portion of the immersion tank, such that data center equipment 102 is retrieved (removed) and installed vertically through the opening.

In FIG. 1, data center equipment 102 is shown immersed in an immersion tank 101. The data center equipment 102 is mounted to a carrier tray 104 of a carrier assembly. The carrier assembly has one or more extendable sliders 108 that connect at a first connection to the carrier tray. At a second connection, the one or more extendable sliders connect to the immersion tank 101 (e.g., to an interior wall 105 of the immersion tank). It should be understood that connections made, for example, between any of the sliders, the immersion tank, the handles, the carrier tray, and adapter brackets, can be formed from any combination of known connection hardware such as, but not limited to, nuts, bolts, screws, brackets, interlocking tabs, threads, holes, etc.

A technician can open a lid 99 of the immersion tank, to expose an opening 109 of the immersion tank. The carrier tray and data center equipment can be in a first position, immersed in fluid within the immersion tank, as shown in FIG. 1. The technician can grab one or more handles 106, which can be located at a top edge 107 of the tray facing upwards and accessible at the opening 109. The technician can lift the tray and equipment upward and out of the immersion tank through the opening, into a second position, as shown in FIG. 2. The tray and data center equipment can by lifted out of the immersion tank either partially or completely.

During servicing, when the data center equipment is lifted out of the immersion tank, liquid can drip down back into the immersion tank, thereby reducing spillage of the liquid. The weight of the carrier tray and the equipment can be supported by the one or more extendable sliders, locked in place, so that fewer technicians are required to perform servicing and safety is improved by securing the heavy equipment during the servicing and reducing risk of injury. Heavy equipment (e.g., greater than 50 lbs.) can be lifted out of the immersion tank enclosure with extendable sliders locked into position, supporting the equipment at a preferred stopping position. A total height when fully extended, as shown in FIG. 2, can be up to 2.3 meters, or as tall as the standard IT rack.

Figure 3:
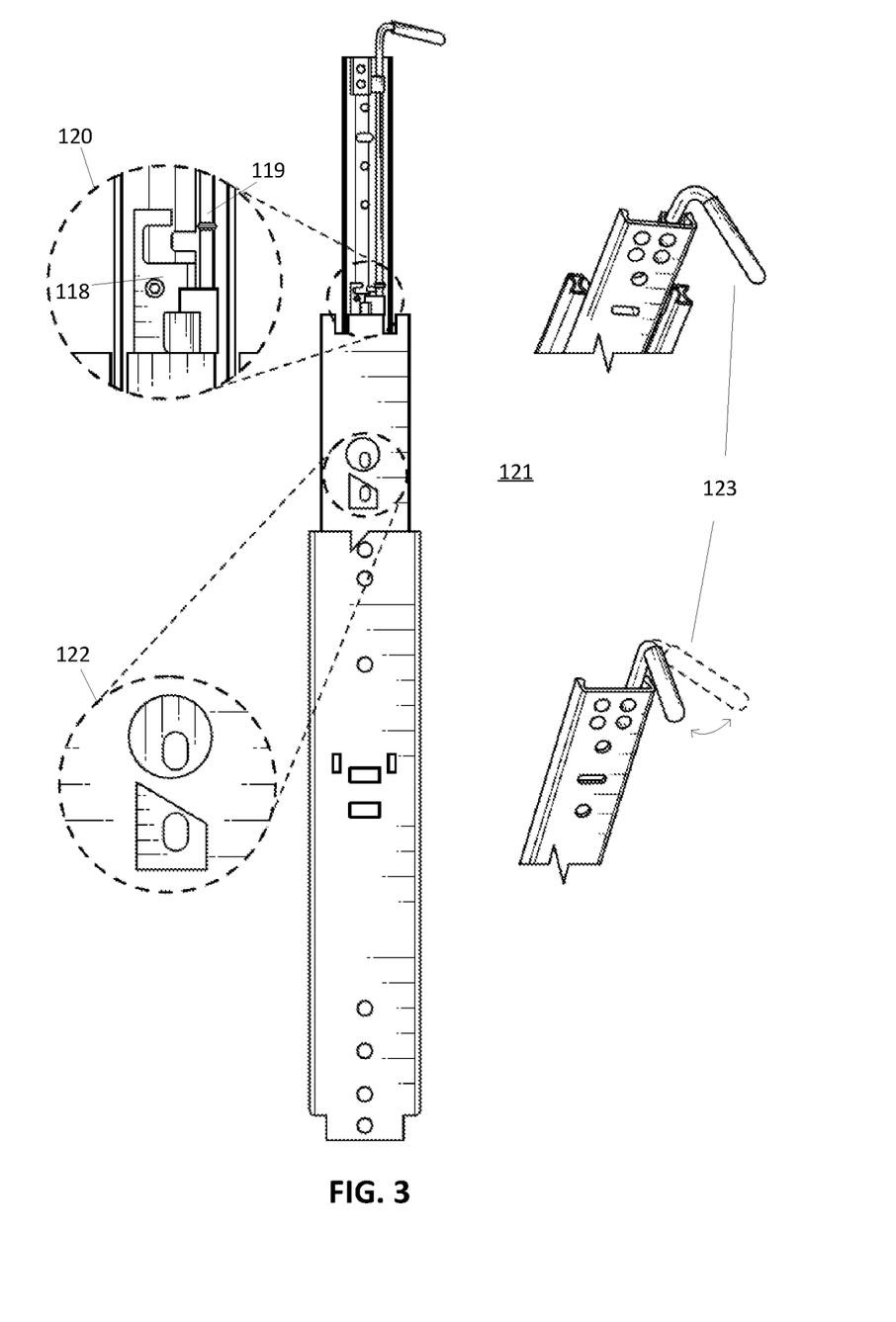
FIG. 3 shows an extendable rail with a locking system, according to one embodiment.

Referring to FIG. 3, an example extendible rack mount slider 121 is shown having a lock latch or lock mechanism 120. When the lock latch is activated, the latch allows movement of the extendable slider 121, and when the lock latch is deactivated, the latch obstructs the movement of the extendable slider. The one or more handles 123 are can be integrated with the lock, so that a technician can activated and deactivate the lock latch while maintaining control of the carrier tray and equipment, as discussed further below. The lock latch can comprise known mechanical arrangements of one or more latching members 118 and detents/stops 122, such that when the lock latch is 'activated' the latching member does not latch onto the detents (e.g., it slides past the detents), but when the lock latch is 'deactivated' the latching member latches onto the detents to prevent movement of the slider and attached carrier tray beyond the latched detent. Accordingly, the movement of the carrier tray and mounted equipment can be obstructed at one or more detents or stops of the extendable slider, and the detents can be positioned anywhere along the slider to accommodate different positions for servicing.

The lock mechanism of the rack mount rail can be activated and deactivated in different manners. When a technician grabs the handles, the technician can activate the lock latch which will allow the technician to pull the equipment out of the immersion tank. When the equipment is at a desirable position out of the immersion tank, the technician can deactivate the lock latch while maintaining a grip on the handles, or by releasing the handles. This prevents the carrier tray and equipment from sliding back into the immersion tank, holding it in place for servicing.

In one aspect, the lock can be activated or deactivated by rotating the one or more handles, as shown in FIG. 3. The handle 123 can be rotated or pushed, which can change a position of a latch so that the latch will either pass the detents, or latch onto the detents.

Figure 4:
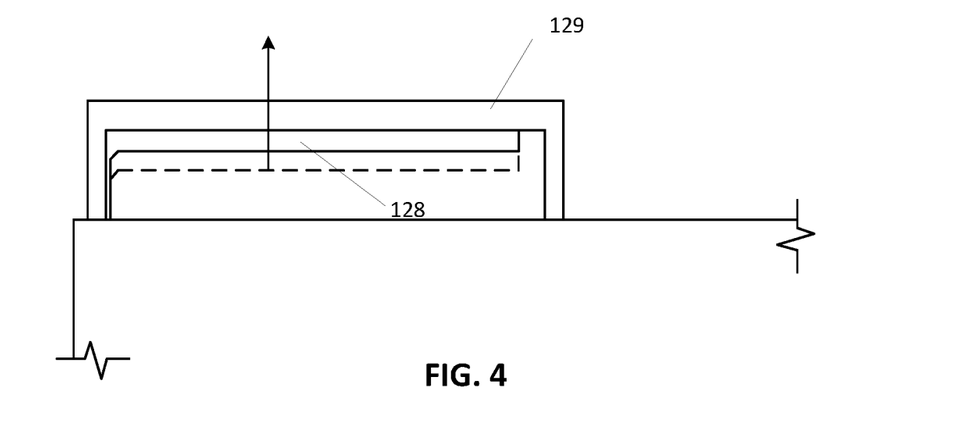
FIG. 4 shows a handle with a lever or actuator, according to one embodiment.

In another aspect, FIG. 4 shows a lock actuator or lever 128 integrated with a handle 129. The locking system is activated by squeezing the lever located along the interior of the one or more handles 129, which allows a user to pull the equipment out of the immersion tank. When the user releases the lever, the lock is deactivated and the equipment is held in place by the extendable slider and the lock, so that the user can perform servicing.

Figure 5:
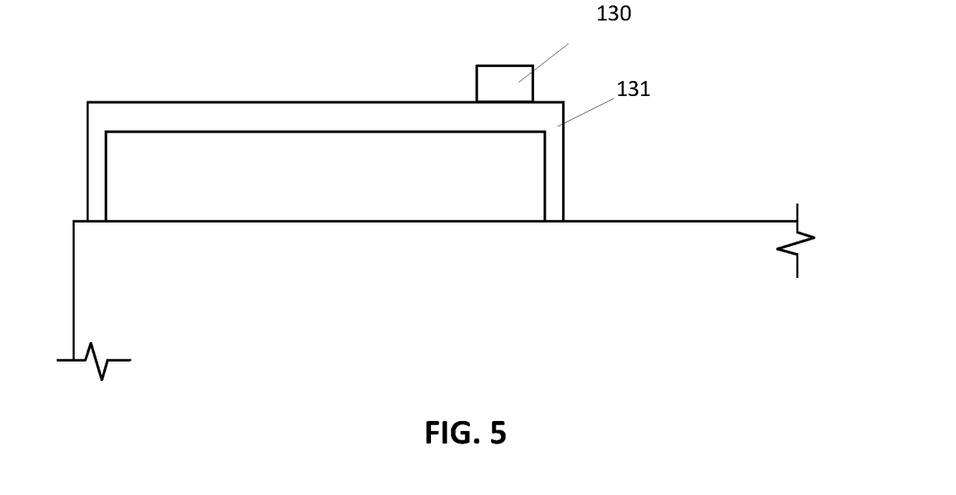
FIG. 5 shows a handle with a button actuator, according to one embodiment.

In another aspect, the lock can be activated and/or deactivated with a button or switch 130 on the handles 131 as shown in FIG. 5. The button can be actuated by pressing, sliding, or rocking/rotating.

In one aspect, the lock can be spring loaded (e.g., with a spring mechanism 119 as shown in FIG. 3) such that the lock returns to being deactivated and locked in place when a user releases the one or more handles 123 of FIG. 3, or the lever 128 of FIG. 4, or the button/switch 130 of FIG. 5. In other words, the lock latch can be a 'normally locked' lock latch, such that it will automatically return to and remain in a locked (deactivated) state. Other locking mechanisms and actuation means are known and can be determined based on application.

Figure 6:
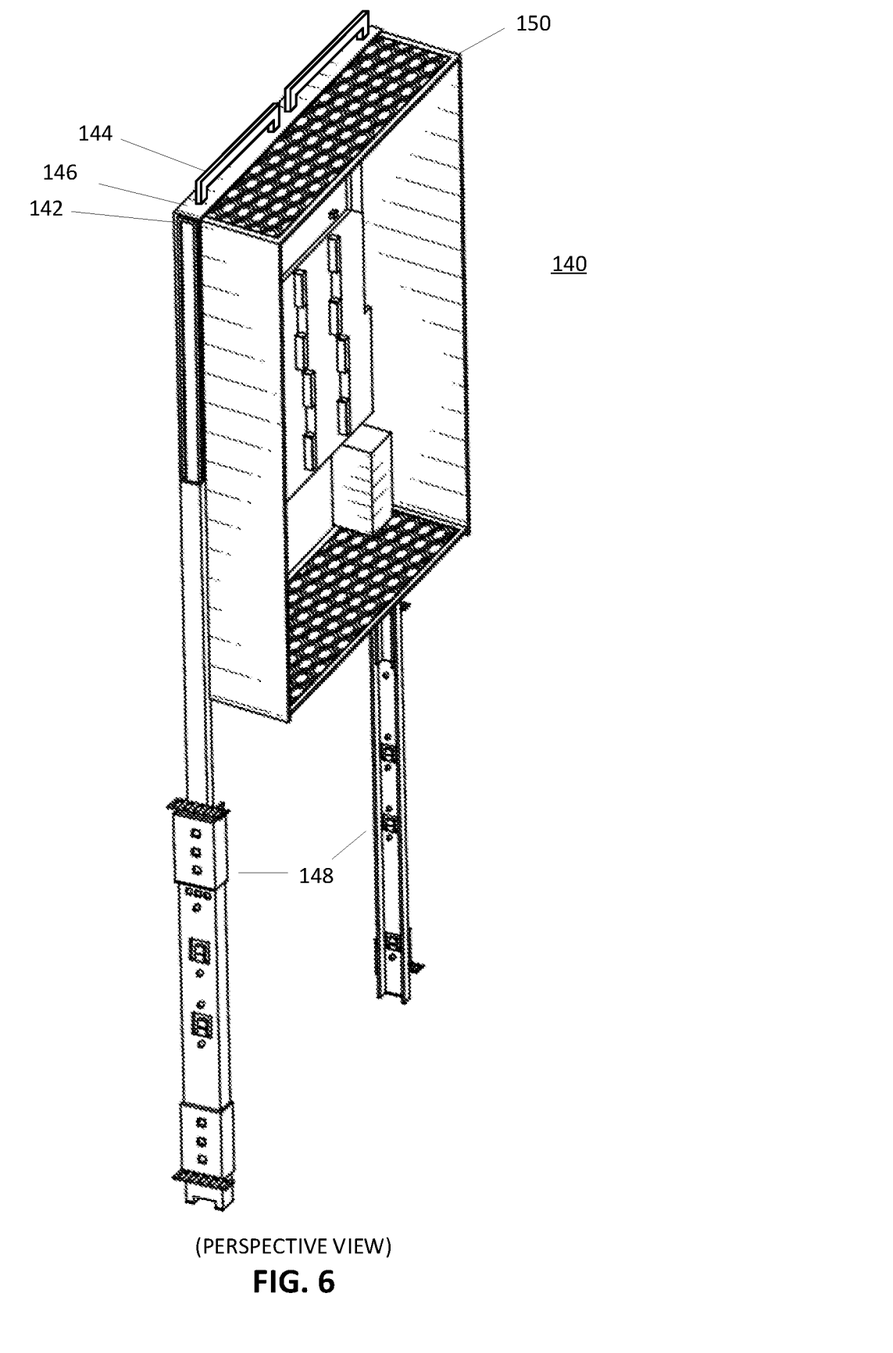
FIGS. 6 and 7 show a carrier assembly, according to one embodiment.
Figure 7:
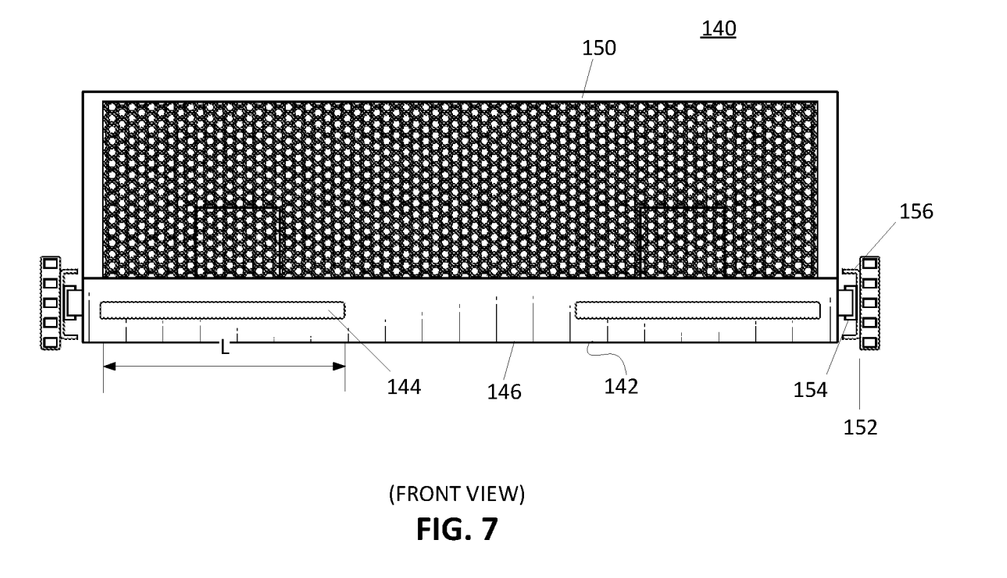

A carrier assembly 140 is shown in FIGS. 6 (perspective view) and 7 (front view). The carrier assembly includes a carrier tray 142, one or more extendable sliders 148, and one or more handles 144. An open data center committee (ODCC) standard chassis 150 is shown mounted onto the carrier tray 142 of the carrier assembly. The carrier tray is the body portion of the carrier assembly, and can be formed from suitably strong materials, such as, but not limited to, steel, aluminum, polymer, carbon fiber, etc.

The extendable sliders 148 are shown in an extended position in FIG. 6. In one aspect, each of the one or more handles 144 has a gripping length L that runs parallel to, or along, the top edge 146 of the carrier tray. This can provide a compact geometry (e.g., flat) of the carrier assembly, while maintaining the direction of the upward force close to the sliders to minimize torque. In addition, not all data center equipment has handles that are designed specifically to support immersion cooling. Typical side mount chassis handles are designed for legacy products, and are oriented in the wrong direction for the immersion cooling solution, with the side mount handles creating a point load for the user, which is not only uncomfortable for users, but can cause injury or damage to the enclosure, if applied for immersion solution. The design of the side mount adapter brackets can be designed to obstruct the user access to the side mount chassis handles. In another embodiment, for example, where the carrier tray accommodates larger data center equipment, the handles can be fixed perpendicular to the top edge 146.

Figure 8:
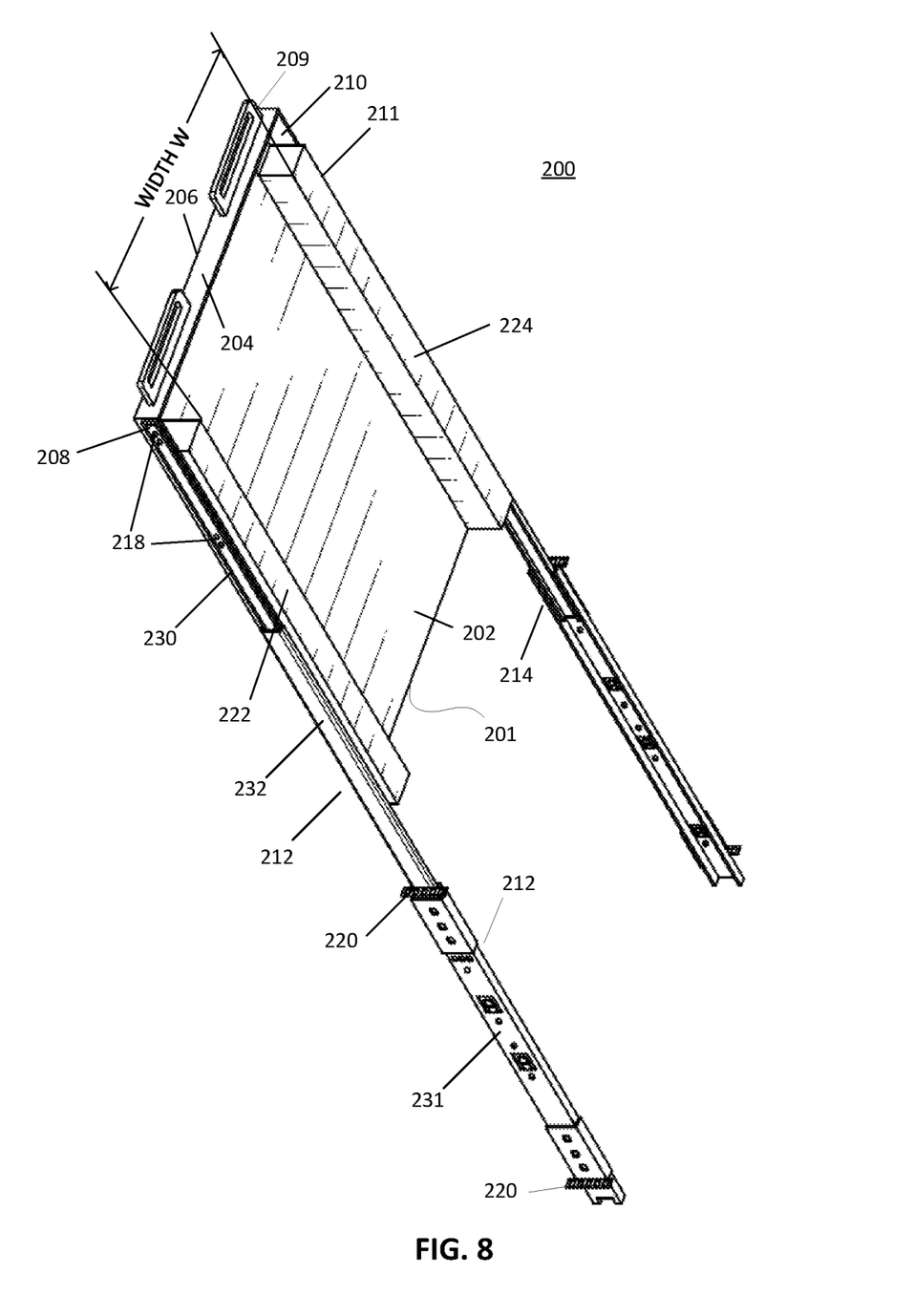
FIGS. 8 and 9 show a carrier assembly with width adapter brackets, according to one embodiment.

Referring to FIG. 8, a carrier assembly 200 is shown with adapter brackets 222 and 224 that provide adaptable mounting points for various data center equipment. A carrier tray 201 can have a rectangular base portion 202 with a top wall 204 located at a top edge 206 of the base portion, a first side wall 208 located at a side edge 209 of the base portion adjacent to the top edge, and a second side wall 210 located at a second side edge 211 of the base portion, the second side wall being opposite of the first side wall. The top wall can provide a structurally sound location to fix the handles 209 onto.

A first extendable slider 212 is located at the first side wall 208 of the carrier tray and a second extendable slider 214 can be located at the second side wall 210 of the carrier tray. The first slider 212 can have a first connection (at one or more connection points 218) to the carrier tray (e.g., at the side wall 208) and a second connection (e.g., at one or more connection points 220) to an immersion tank. The second connection can be made to one or more brackets (not shown) that can mount onto an interior wall of the immersion tank. Other mounting and connection means can be determined and implemented with routine experimentation. The second slider 214 can also have a first connection that connects to the carrier tray and a second connection to the immersion tank, as described for the first slider.

In one aspect, as shown in FIG. 8, each extendable slider 212 can include an inner slide guide rail 230 that connects, at a first connection 218, to the carrier tray. This connection can be made at the first side wall 208 of the carrier tray, as shown, and/or other locations of carrier tray. The slider can have an outer slide guide rail 231 that connects, at a second connection 220 to the immersion tank. One or more intermediate slide guide rails 232 can be arranged between the inner slide guide rail and the outer slide guide rail, to add support and/or extension length. Each slide guide rail can be an elongated member with rails that interlock with other slide guide rails and allow sliding along the length of the elongated members. In this manner, the extendable slider can slide the carrier tray between the first position and the second position, vertically in and out of the immersion tank.

Figure 9:
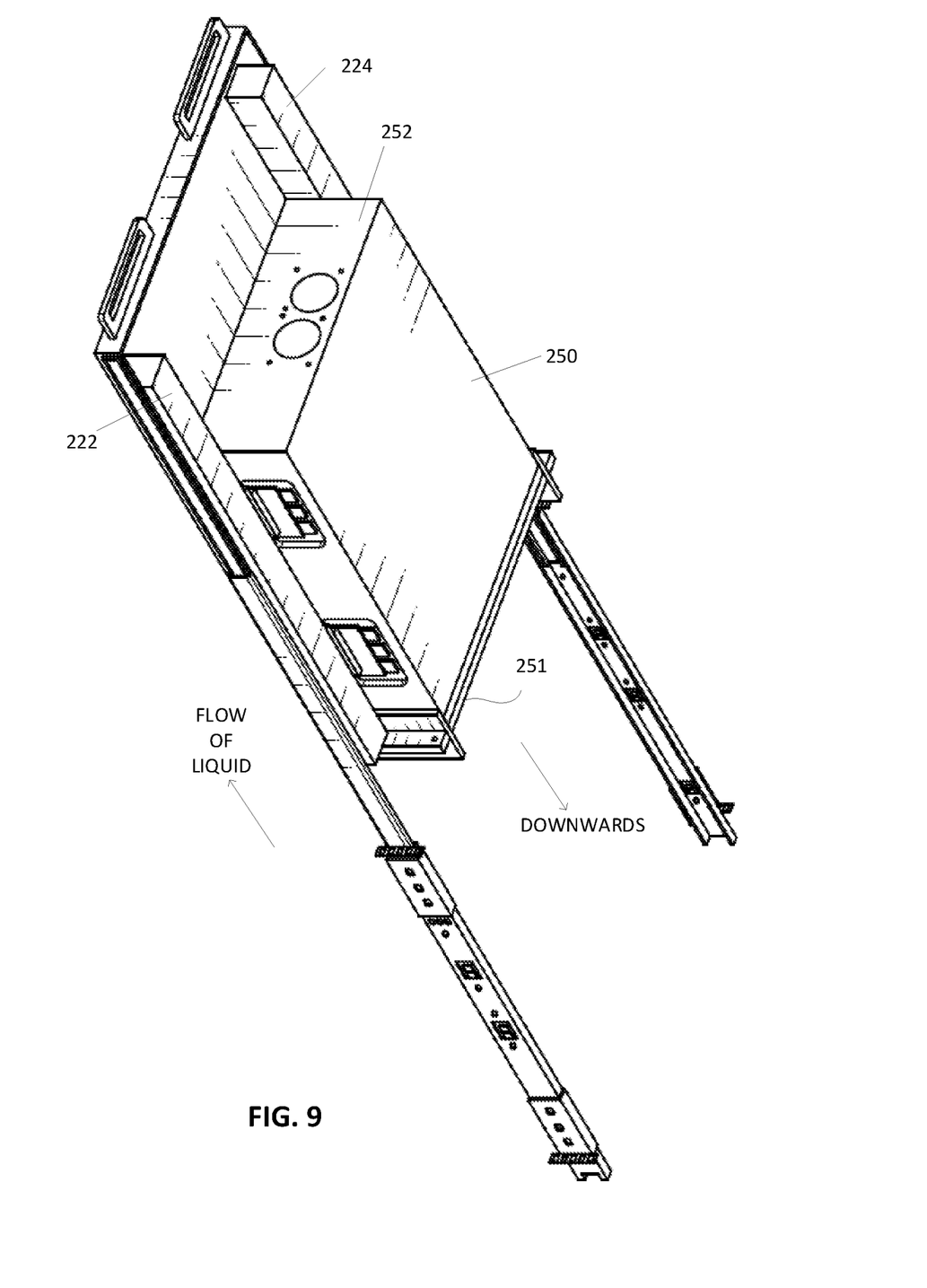

FIG. 9 shows data center equipment 240 mounted to the carrier assembly via the adapter brackets. The mounting mechanism (e.g., brackets, bolts, holes, threads, tabs, etc.) to mount the data center equipment to the carrier assembly can be located on a) a first width adapter bracket 222 located along an interior surface of the first side wall 208, and b) a second width adapter bracket 224 located along an interior surface of the second side wall 210. The width adapter brackets can accommodate mounting points for data center equipment that have different widths W. For example, FIG. 9 shows a standard EIA-310D 19" width chassis that mounts to width adapters 222 and 224. Data center equipment having a larger width can mount directly to the carrier tray, as shown in FIGS. 6 and 7. In such a case, the equipment can mount to the side walls of carrier tray, and/or to the base portion of the carrier tray. The adapter features have provisions (e.g., compatible fastening hardware) to utilize the existing chassis mounting features of data center equipment.

In one aspect, the mounting mechanism has an arrangement that mounts data center equipment such that a front face of the equipment faces downwards, relative to the opening at the top of the vertical immersion tank. For example, as shown in FIG. 9, when the data center equipment is immersed in the immersion tank, flow of immersion liquid through the data center equipment can match that of an air cooled chassis, with the liquid moving upwards from the front face 251 of the data equipment to the back 252 of the equipment.

In addition, although FIGS. 6, 7, and 8 show sliders on opposite sides of the carrier tray, one or more sliders can alternatively or additionally be connected to the base portion of the carrier tray, the sliders being located between the carrier tray and the immersion tank when assembled together. In such a case, all other aspects of the present disclosure can still apply.

In one aspect, as illustrated in other sections, an immersion tank has a carrier tray attached to an interior wall of the tank. The carrier tray includes a mounting mechanism to attach one or more electronic components to the carrier tray, one or more handles, and one or more extendable sliders, each having a first connection to the carrier tray and a second connection to an interior wall of the immersion tank. The immersion tank can rest on a ground surface, and have an opening that faces upward and opposite of the ground surface. In a first position of the one or more extendable sliders, the carrier tray is within the immersion tank, and in a second position of the one or more extendable sliders, the carrier tray is at least partially lifted out of the opening of the immersion tank.

It should be understood that the various features shown with respect to one figure can also be present in other embodiments of different feature.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A carrier assembly comprising
a carrier tray having a mounting mechanism to attach one or more electronic components to the carrier tray;
one or more handles; and
an extendable slider having a first connection to the carrier tray and a second connection to a vertical immersion tank, wherein the vertical immersion tank has an opening that faces upward, and in a first position of the extendable slider, the carrier tray is within the immersion tank, and in a second position, the carrier tray is vertically lifted at least partially out of the opening of the immersion tank.

2. The carrier assembly of claim 1, wherein the extendable slider has a lock latch that, when the lock latch is activated, the lock latch allows movement of the extendable slider, and when the lock latch is deactivated, the lock latch obstructs the movement of the extendable slider.

3. The carrier assembly of claim 2, wherein, when the lock latch is deactivated, the movement is obstructed at one or more detents of the extendable slider.

4. The carrier assembly of claim 2, wherein the lock latch is activated or deactivated by an actuation mechanism integrated with the one or more handles.

5. The carrier assembly of claim 4, wherein the lock is spring loaded such that the lock returns to being deactivated when a user no longer actuates the lock or when the user releases the one or more handles.

6. The carrier assembly of claim 4, wherein the lock is activated or deactivated by rotating the one or more handles.

7. The carrier assembly of claim 4, wherein the lock is activated by squeezing a lever located along the one or more handles and deactivated by releasing the lever.

8. The carrier assembly of claim 1, wherein, in the second position, a weight of the carrier tray and equipment mounted on the carrier tray is supported by the extendable slider.

9. The carrier assembly of claim 1, wherein the one or more handles are located at a top edge of the carrier tray and is accessible at the opening of the immersion tank.

10. The carrier assembly of claim 9, wherein each of the one or more handles has a gripping length that runs parallel to the top edge of the carrier tray.

11. The carrier assembly of claim 1, wherein the carrier tray has a rectangular base portion with a top wall located at a top edge of the base portion, a first side wall located at a side edge of the base portion adjacent to the top edge, and a second side wall located at a second side edge of the base portion, the second side wall being opposite of the first side wall.

12. The carrier assembly of claim 11, wherein the one or more handles are fixed to the top wall of the carrier tray.

13. The carrier assembly of claim 11, wherein the extendable slider is located at the first side wall of the carrier tray and the carrier assembly further includes a second extendable slider that is located at the second side wall of the carrier tray, the second extendable slider also having a first connection to the carrier tray and a second connection to the immersion tank.

14. The carrier assembly of claim 11, wherein the mounting mechanism includes a bracket, bolt, hole, thread, or tab located on a) a first width adapter bracket located along an interior surface of the first side wall, and b) a second width adapter bracket located along an interior surface of the second side wall.

15. The carrier assembly of claim 11, wherein the mounting mechanism includes a bracket, bolt, hole, threads, or tab being located on the first side wall, the second side wall, or the base portion.

16. The carrier assembly of claim 11, wherein the mounting mechanism has an arrangement that mounts a server chassis with a front face pointed downward.

17. The carrier assembly of claim 1, wherein the first connection of the extendable slider is located at an inner slide guide rail of the extendable slider and the second connection of the extendable slider is located at an outer slide guide rail of the extendable slider, the inner slide guide rail sliding along a length of the outer guide slide rail to slide the carrier tray between the first position and the second position.

18. The carrier assembly of claim 17, wherein one or more intermediate slide guide rails are arranged between the inner slide guide rail and the outer slide guide rail to provide additional extension of the carrier tray out of the immersion tank.

19. A liquid immersion cooling system comprising:
an immersion tank for housing cooling liquid;
a carrier tray having
a mounting mechanism to attach a data center equipment to the carrier tray, the mounting mechanism capable of attaching equipment having varying widths;
one or more handles; and
one or more extendable sliders, each having a first connection to the carrier tray and a second connection to the immersion tank, wherein the immersion tank has an opening that faces upward; and in a first position of the one or more extendable sliders, the carrier tray is within the immersion tank, and in a second position of the one or more extendable sliders, the carrier tray is vertically lifted out of the opening of the immersion tank.

20. An immersion tank, having
a carrier tray having
a mounting mechanism to attach one or more electronic components to the carrier tray;
one or more handles; and one or more extendable sliders, each having a first connection to the carrier tray and a second connection to an interior wall of the immersion tank, wherein the immersion tank rests on a ground surface, and has an opening that faces upward and opposite of the ground surface, and wherein in a first position of the one or more extendable sliders, the carrier tray is within the immersion tank, and in a second position of the one or more extendable sliders, the carrier tray is at least partially lifted out of the opening of the immersion tank.

\* \* \* \* \*